United States Patent
Matsumoto et al.

(10) Patent No.: US 7,592,065 B2
(45) Date of Patent: Sep. 22, 2009

(54) INSULATED ULTRAFINE POWDER, PROCESS FOR PRODUCING SAME AND RESIN COMPOSITE MATERIAL WITH HIGH DIELECTRIC CONSTANT USING SAME

(75) Inventors: Takahiro Matsumoto, Ibaraki (JP); Toshiaki Yamada, Ibaraki (JP); Hirotaka Tsuruya, Ibaraki (JP)

(73) Assignee: Mitsubishi Gas Chemical Company Inc., Tokyo (JP)

(*) Notice: Subject to any disclaimer, the term of this patent is extended or adjusted under 35 U.S.C. 154(b) by 355 days.

(21) Appl. No.: 10/777,082

(22) Filed: Feb. 13, 2004

(65) Prior Publication Data

US 2004/0162365 A1  Aug. 19, 2004

(30) Foreign Application Priority Data

Feb. 17, 2003 (JP) ............................. 2003-038680
Aug. 29, 2003 (JP) ............................. 2003-305966

(51) Int. Cl.
  *B32B 5/16* (2006.01)
  *H01B 1/08* (2006.01)
  *H01B 1/20* (2006.01)
  *C01G 30/00* (2006.01)
  *C01G 19/00* (2006.01)

(52) U.S. Cl. .................... 428/403; 428/404; 252/520.1; 423/618; 423/624; 106/441; 106/455; 524/430

(58) Field of Classification Search ................ 252/500, 252/514, 518.1, 520.1; 428/403, 357, 404; 106/441, 445; 977/773, 762
See application file for complete search history.

(56) References Cited

U.S. PATENT DOCUMENTS 5,294,374 A * 3/1994 Martinez et al. ............ 252/516
5,296,168 A * 3/1994 Jacobson .................... 428/403

(Continued)

FOREIGN PATENT DOCUMENTS

JP  2001-237507  8/2001

(Continued)

OTHER PUBLICATIONS

MTI Data Sheet, 2002, pp. 1-5.*

(Continued)

*Primary Examiner*—Stanley Silverman
*Assistant Examiner*—Kallambella Vijayakumar
(74) *Attorney, Agent, or Firm*—Antonelli, Terry, Stout & Kraus, LLP.

(57) ABSTRACT

There are disclosed insulated ultrafine powder comprising electroconductive ultrafine powder which is in the form of sphere, spheroid or acicular each having a minor axis in the range of 1 to 100 nm and an insulating film applied thereto; a process for producing the same which is capable of covering the surfaces of the insulated ultrafine powder with the insulating film having a thickness in the range of 0.3 to 100 nm without causing any clearance or vacancy; and a resin composite material which uses the same. A high dielectric constant of the material is assured by adding a small amount of insulated ultrafine powder wherein an insulating film is applied to the electroconductive ultrafine powder, while maintaining the processability and moldability that are the characteristics inherent in a resin material.

12 Claims, 1 Drawing Sheet

U.S. PATENT DOCUMENTS

| | | | |
|---|---|---|---|
| 5,424,129 A * | 6/1995 | Lewis et al. | 428/403 |
| 5,518,810 A * | 5/1996 | Nishihara et al. | 428/328 |
| 5,534,193 A | 7/1996 | Jacobson | |
| 5,575,957 A * | 11/1996 | Okuda et al. | 252/520.1 |
| 5,908,574 A * | 6/1999 | Keogh | 219/622 |
| 6,521,677 B2 * | 2/2003 | Yashiro et al. | 523/212 |
| 6,553,966 B2 * | 4/2003 | Cornell et al. | 123/446 |
| 6,908,574 B2 * | 6/2005 | Inamura et al. | 252/518.1 |
| 6,992,431 B2 * | 1/2006 | Ito et al. | 313/478 |
| 2002/0149656 A1 * | 10/2002 | Nohr et al. | 347/95 |
| 2003/0207978 A1 * | 11/2003 | Yadav et al. | 524/435 |

FOREIGN PATENT DOCUMENTS

| | | |
|---|---|---|
| WO | WO 98/20502 | 5/1998 |
| WO | WO 00/14017 * | 3/2000 |
| WO | WO 02/22757 * | 3/2002 |

OTHER PUBLICATIONS

Webster Dictionary, 2007, pp. 1-2.*
Hawley's Condensed Chemical Dictionary, 2002, pp. 1-2.*
European Search Report, for Application No. 04003092.6-2102 PCT, dated Oct. 7, 2005.

* cited by examiner

INSULATED ULTRAFINE POWDER, PROCESS FOR PRODUCING SAME AND RESIN COMPOSITE MATERIAL WITH HIGH DIELECTRIC CONSTANT USING SAME

BACKGROUND OF THE INVENTION

1. Field of the Invention

The present invention relates to insulated ultrafine powder, a process for producing the same and a resin composite material which makes use of the same and features a high dielectric constant. This material is well suited to the formation of an IC (integrated circuit) package, a module substrate and an electronic part integrated with a high dielectric constant layer. In particular, the material is well suited to the formation of an inner layer capacitor layer of a multi-layer system wiring substrate. In addition, the material is useful for miniaturizing built-in antenna for wireless LAN and RFID (Radio Frequency Identification) and also thinning electromagnetic absorption sheets, units and panels which prevent electric wave interference inside a high frequency electronic machinery and equipment.

2. Description of the Related Arts

As one of the causes for data errors of an IC, there exists influence due to a high frequency noise. There is known a method for removing a high frequency noise by equipping a wiring substrate with a capacitor having a large capacity, which is materialized by forming a high dielectric constant layer on a wiring substrate. With regard to miniaturization of built-in antenna for wireless LAN and RFID (Radio Frequency Identification) and thinning of electromagnetic absorption sheets, units and panels, the sizes thereof are each in nearly inverse proportion to the square root of the dielectric constant and accordingly, a high dielectric constant material is useful for miniaturization and thinning of these members. In particular, it is required to impart the above-mentioned characteristics to a resin material excellent in processability and moldability.

There is proposed as a prior art, a resin composite material incorporated with at least 65 vol % of a ferro-electric material typified by barium titanate as a high dielectric constant filler (refer to Japanese Patent Application Laid-Open No. 237507/20001). The reason for necessity of a large amount addition of such strongly dielectric filler is described hereunder. In the case of a small amount of the filler being added, a high dielectric constant filler is made into a state of being insulated to a resin having a relative dielectric constant of about 3. When this state is taken into consideration by means of an equivalent circuit, it is represented by a series circuit including a low capacitance corresponding to a low dielectric constant resin and a high capacitance corresponding to a high dielectric constant filler. Since in this case, the reciprocals of the dielectric constant have additive properties, even when the high dielectric constant filler is added at a rate of, for instance, 50 vol %, the dielectric constant of the resin composite material is made to be as low as about 6. In order to avoid such inconvenience, the equivalent circuit of the composite material needs to be a parallel circuit. Thus as a preferable embodiment, it is necessary to form a continuous layer of the high dielectric constant filler inside the composite material.

In order to form such a continuous layer and thus contrive high dielectric constant of the composite material, it has been made necessary to add at least 65 vol % of a high dielectric constant filler as a ferro-electric material. Such being the case, for the purpose of realizing a relative dielectric constant of at least 20, it is made necessary to add at least 80 wt % (50 vol %) of a high dielectric constant filler as a ferro-electric material, whereby the processability and moldability that are the characteristics inherent in a resin material are unfavorably impaired in compensation for the achievement of a high dielectric constant. No countermeasure has heretofore been taken at all in any of the prior arts regarding the essential cause for a large amount of a filler to be added.

SUMMARY OF THE INVENTION

In the light of the above-mentioned circumstances, a general object of the present invention is to provide a means for achieving a high dielectric constant of a resin composite material, while suppressing the rate of adding a filler so as to enable to maintain the processability and moldability that are the characteristics inherent in a resin material.

Other objects of the present invention will become obvious from the text of this specification hereinafter disclosed.

Intensive extensive research and investigation were made by the present inventors on the formation of a continuous layer of a filler in a resin material and the achievement of a high dielectric constant of nanometer-sized particle. As a result, the present invention has been accomplished on a means for solving the subject as mentioned before. That is to say, it has been found that insulated ultrafine powder in which the surfaces of electroconductive ultrafine powder are covered with a insulating material is capable of enhancing the dielectric constant of a resin composite material even in a small amount of filler to be added being 5 to 50 vol %.

Specifically, the present invention enables the achievement of a high dielectric constant of a resin composite material by adding a small amount of insulated ultrafine powder in which an insulating film is applied to the electroconductive ultrafine powder, while maintaining the processability and moldability that are the characteristics inherent in a resin material.

DESCRIPTION OF THE PREFERRED EMBODIMENTS

Figure 1:
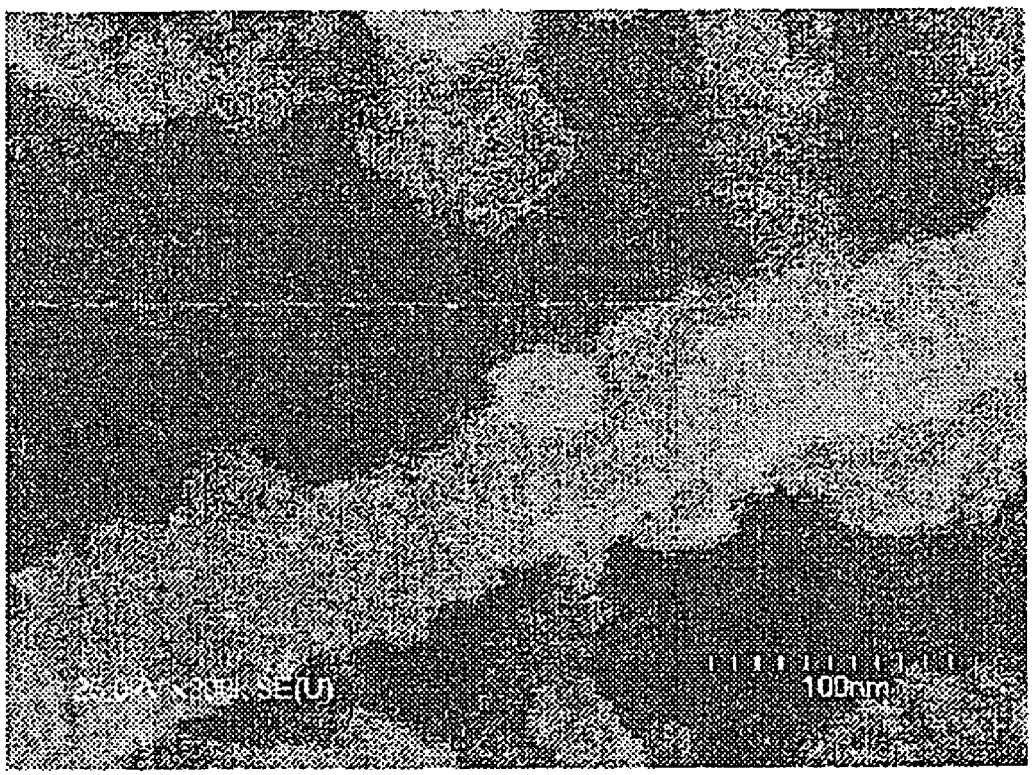
FIG. 1 is an electron photomicrograph showing the condition in Example 1 wherein the particles formed by sol-gel reaction are stuck onto acicular tin oxide doped with antimony.

The electroconductive ultrafine powder to be employed in the present invention is effective in decreasing the volume resistivity of a resin composite material, that is, imparting electroconductivity thereto, when added alone thereto. Examples of materials constituting such electroconductive ultrafine powder include an electroconductive carbon material such as furnace carbon black, graphitized carbon black and nanometer-sized carbon tube; a metal in the form of simple body such as aluminum, copper, gold, silver, platinum, tin, palladium, nickel and an alloy containing at least one of the above-exemplified metals.

The material which is desirable for the electroconductive ultrafine powder to be used in the present invention is an electroconductive metal oxide. Ultrafine powder of a metal excluding part of noble metals is not only liable to be oxidized and lowered in electroconductivity, but also has the possibility of dust explosion. In addition, metallic atoms diffuse from the ultrafine powder into media of an insulant, thereby lowering the insulating properties of a resin composite material.

For these reasons, preferable electroconductive ultrafine powder to be used in the present invention includes electroconductive oxides such as stanic oxide doped with antimony, indium trioxide doped with tin, zinc oxide doped with aluminum or gallium and a composite oxide exemplified by barium plumbate. Of these, stannic oxide doped with antimony is particularly desirable from the aspect of manufacturing cost.

The electroconductive ultrafine powder to be used in the present invention is spherical, spheroidal or acicular electroconductive ultrafine powder having a minor axis in the range of 1 nm to 100 nm. In the case of the powder being in the form of sphere, the minor axis, which is same as the particle diameter thereof, is in the range of 1 nm to 100 nm, preferably 5 nm to 70 nm. In the case of the powder being in the form of spheroid, the minor axis is in the range of 1 nm to 100 nm, preferably 5 nm to 70 nm, and the aspect ratio is preferably in the range of 3 to 30. In the case of the powder being in the form of acicular, the minor axis is in the range of 1 nm to 100 nm, preferably 5 nm to 70 nm. The minor axis, when being smaller than the above-mentioned lower limit, gives rise to deteriorated electroconductivity due to quantum size effect, whereas the minor axis, when being larger than the above-mentioned higher limit, brings about a failure in forming a continuous layer in the range of rate of addition being 40% or less, that is, the range not deteriorating the characteristics inherent in a resin material. With regard to the electroconductive ultrafine powder to be used in the present invention, acicular is preferable to sphere, since the acicular needs less amount of the powder to be added for the purpose of forming a continuous layer with a resin composite material having a relative dielectric constant of at least 20. The acicular electroconductive ultrafine powder has an aspect ratio in the range of preferably 2 to 100, more preferably 10 to 40.

The insulating film to be used in the present invention, which is intended in part to assure the overall insulating properties of the resin composite material, excludes a surface protection film such as a simple antioxidant film. The thickness of the insulating film in the present invention is preferably 0.3 nm or larger when observed with an electron microscope and at the same time, not larger than the minor axis of the electroconductive ultrafine powder. The value of "d" which is defined by the following formula represents an approximate thickness of the insulating film. The value d, when being 0.3 nm or larger, leads to a high possibility that the insulating film thickness as observed with an electron microscope comes to be 0.3 nm or larger, thus rendering itself a useful guide to the evaluation of the insulating effect.

$$d = w/(S \times p)$$

wherein w: ratio by weight of insulating film to electroconductive ultrafine powder S: specific surface area of electroconductive ultrafine powder p: true density of material constituting insulating film d is the approximate thickness of the insulating film which is calculated from w, S and p. The case will be considered when one (g) of the electroconductive ultrafine powder is covered with w (g) of an insulating material. The product of d (thickness of the insulating film) and S (specific surface area) is the approximate volume of the insulating film. Accordingly, when p (true density of insulating film material) is used with one (g) of the electroconductive ultrafine powder, S d p≈w. However d is not more than the approximate value and depending upon the agglomeration state of the electroconductive ultrafine powder at the time of a covering treatment, an insulating film as thick as about 5 to 10 times d is sometimes formed on the secondary particle surfaces that are actually observable. Nevertheless as mentioned hereinbefore, the value d still becomes a useful guide to the evaluation of the insulating effect.

It is desirable that the insulating film thickness be in the range of at least 0.3 nm and at most the minor axis of the electroconductive ultrafine powder and that the ratio of the particle diameter of the covering electroconductive powder to the minor axis of the electroconductive ultrafine powder be in the range of 0.01 to 0.9, more preferably 0.01 to 0.5. The aforestated ratio, when being 0.01 or more, brings about sufficient working effect on insulation and prevention of conduction, thus sufficiently functioning as a dielectric, and when being 0.9 or less, prevents the dielectric constant of the resin composite material from being deteriorated.

Examples of the insulating film material include an oxide and a nitride each having insulating properties such as silicon dioxide and trisilicon tetranitride, and a metal oxide having insulating properties such as dialuminum trioxide and zircon oxide. Preferable examples thereof include a metal oxide having insulating properties and a dielectric constant of 20 or more such as ditantalum pentaoxide, titanium dioxide of type anatase and brookite; and more preferably a metal oxide having a dielectric constant of 100 or more which is exemplified by a titanium-containing metal oxide such as titanium dioxide of type rutile, barium titanate, strontium titanate, lead titanate, barium zirconate titanate, lead zirconate titanate and a solid solution which has insulating properties and contains at least one of the above-exemplified species. These oxides and nitrides each having insulating properties are suitable because of their dielectric constant being high and not lowered even when thickly applied onto a composite material.

The insulated ultrafine powder is produced, for instance, by a process which comprises the steps of dispersing electroconductive ultrafine powder in an organic solvent such as an alcohol; performing sol-gel reaction by adding a metal alkoxide in the resultant dispersion to precipitate a metal oxide containing the electroconductive ultrafine powder as the nucleus; further conducting dehydration condensation reaction in an organic solvent or reacting a metal salt with an alkali in an aqueous solution in which the electroconductive ultrafine powder is dispersed so as to precipitate a metal oxide containing the electroconductive ultrafine powder as the nucleus; and subjecting the same to dehydration condensation by means of filtration and drying, so that a state can be formed such that the metal oxide having insulating properties are stuck to the surfaces of the electroconductive ultrafine powder. In this case, an alkali may be added dropwise to the dispersion which has been formed in advance, by dispersing the electroconductive ultrafine powder in the aqueous solution of the metal salt, alternatively the aqueous solution of the metal salt and the aqueous solution of the alkali may be simultaneously or consecutively added dropwise to the aqueous dispersion of the electroconductive ultrafine powder.

In the case of the above-described covering method by the use of the liquid phase precipitation reaction, a porous film is formed such that the oxide ultrafine powder is stuck only to the electroconductive ultrafine powder, usually bringing about the condition in which the metal oxide as the insulating film does not wholly cover the surfaces of the electroconductive ultrafine powder. A vacancy, when caused on the insulating film layer, gives rise to such a problem as lowered dielectric constant. For this reason, it is necessary in the present invention to calcine or sinter the insulating film layer by heating at a temperature higher than the temperature at which surface atomic diffusion of the metal oxide stuck to the surfaces of the electroconductive ultrafine powder takes place and also at a temperature lower than the melting point thereof. Thereby the surfaces of the insulated ultrafine powder are covered with the insulating film having a thickness in the range of 0.3 to 100 nm without causing any clearance or vacancy. Preferably, the oxide has insulating properties and a relative dielectric constant of at least 20. The calcination temperature of the electroconductive ultrafine powder bearing a metal oxide deposited on the surfaces thereof is lower than the melting point of the aforesaid metal oxide by 100 to 900° C. For instance, in the case of using rutile type titanium dioxide having a melting point of 1270° C., the calcination temperature thereof is preferably 670° C. or higher. In the case of using barium titanate having a melting point of 1620° C., the calcination temperature thereof is preferably 800° C. or higher. The calcination time is usually in the range of 0.5 to 12 hours. By the foregoing procedure, the insulating film having a relative dielectric constant of at least 20 is formed without any clearance or vacancy.

The insulated ultrafine powder according to the present invention is spherical, spheroidal or acicular insulated ultrafine powder having a minor axis in the range of 1 nm to 100 nm, and enables to obtain a resin composite material having a high dielectric constant and a relative dielectric constant of at least 20 by blending in the resin in an amount of 50 vol % or less. In order to realize a resin composite material having a high dielectric constant and a relative dielectric constant of at least 20, it has been necessary to add at least 65 vol % of a conventional high dielectric constant filler, whereas the use of the insulated ultrafine powder according to the present invention needs to blend only 50 vol % or less. For this reason, the resin composite material blended with the insulated ultrafine powder according to the present invention can exhibit a high dielectric constant without impairing the processability and moldability that are the characteristics inherent in a resin material.

Examples of the resin components to be added to the above-mentioned insulated ultrafine powder in the present invention include a polymerizable compound of a monomer or an oligomer of a thermosetting resin such as pheoxy resin, epoxy resin, cyanate ester resin, vinyl ester resin, phenolic resin, xylene resin, melamine resin and polyurethane resin; a thermoplastic resin such as phenoxy resin, fluorocarbon base resin, PPS resin, PPE resin, polystyrene resin, polyolefin resin, polyimide resin and polyamide resin; and mixed base resin of the above-exemplified resin. Of these, a resin composition containing epoxy resin is particularly desirable, since it has highly strength of adhesion to a layer of a metal such as copper.

The above-mentioned resin composite material having a high dielectric constant may be used by adding thereto a filler such as glass fiber when necessary for a reason other than the dielectric constant.

In the present invention, the blending ratio of the insulated ultrafine powder to the resin (volume of the powder/volume of the resin) is in the range of preferably 5/95 to 50/50, more preferably 5/95 to 20/80. The insulated ultrafine powder, when being blended at a ratio of more than 5/95, enables a continuous layer to be formed in the resin composition, thus assuring a sufficient dielectric constant thereof. On the other hand, the powder, when being blended at a ratio of less than 50/50, prevents the characteristics inherent in a resin composition such as processability from being impaired. Incidentally, when the resin is blended with the insulated ultrafine powder, the resin may be not only in the form of polymer but also in the form of a polymerizable compound, following polymerizing the compound after blending.

In the following, the present invention will be described in more detail with reference to comparative examples and working examples, which however shall never limit the present invention thereto.

EXAMPLE 1

Figure 2:
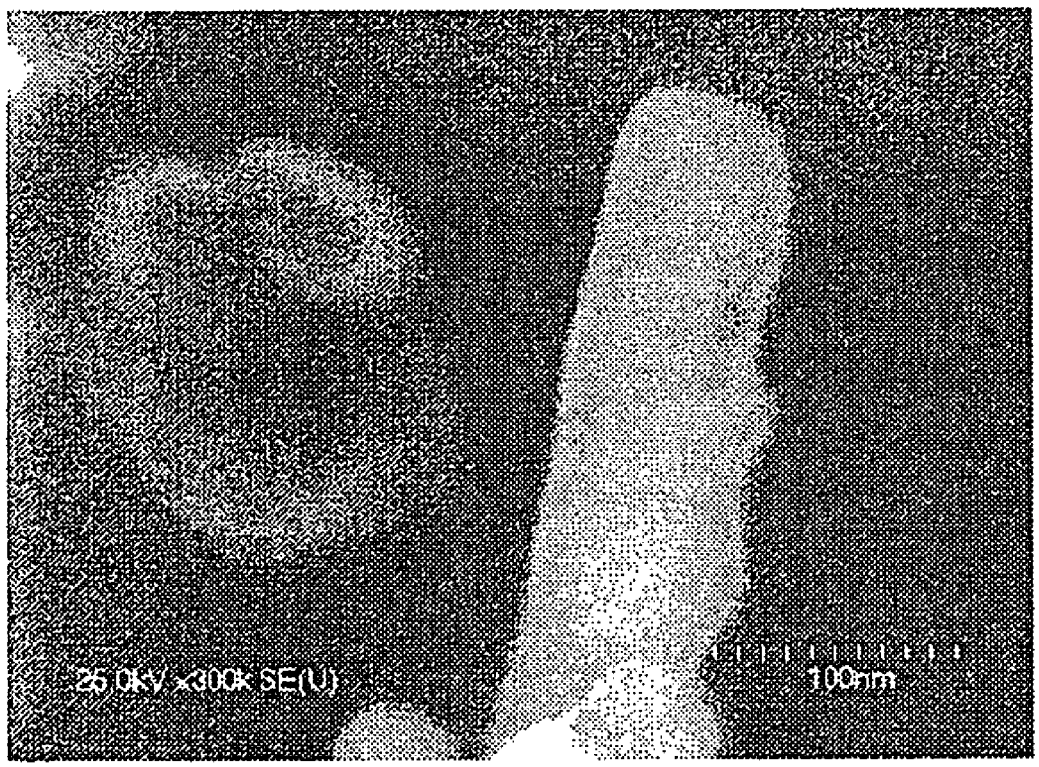
FIG. 2 is an electron photomicrograph showing the fact that in Example 1, an insulated ultrafine powder is formed by calcination at 1000° C.

To 200 g of isopropanol were added 50 g of acicular tin oxide which was doped with antimony and had a minor axis of 10 to 20 nm, a major axis of 200 to 2000 nm and a specific surface area of 25 to 35 $m^2/g$ (manufactured by Ishihara Sangyo Co., Ltd. under the trade name "FS-10P") and 27 g of tetrapropyloxy titanate under stirring mixing at room temperature (20-30° C.) for 30 minutes by the use of an agitator. Then 134 g of a mixed solution of distilled water and isopropanol (weight ratio of 1:6) was added dropwise to the resultant dispersed solution over a period of 30 minutes. After the completion of dropwise addition, stirring was continued for further 30 minutes. Subsequently the resultant mixture was filtered, the cake was air-dried, followed by vacuum drying at 100° C. As illustrated in FIG. 1, amorphous titanium hydroxide particle adhesion to the acicular tin oxide doped with antimony through the sol-gel reaction was confirmed with a scanning electron microscope. The resultant powder was calcined at 1000° C. for 3 hours in a muffle furnace. As illustrated in FIG. 2, multi-layer constitution of the calcined powder was confirmed with the scanning electron microscope. The insulated ultrafine powder thus obtained had a minor axis of 15 to 40 nm, a major axis of 200 to 2000 nm, and was covered on the surfaces thereof with an insulating film composed of rutile type titanium dioxide having a thickness of 5 to 10 nm without causing any clearance or vacancy. Thus, the ratio by weight of the titanium dioxide to the acicular tin oxide doped with antimony was 0.2:1, the specific surface area of the acicular tin oxide doped with antimony was 25 to 35 $m^2/g$, and the value "d" relating to the insulating film was 1.67 nm. The difference between the value "d" and the value observed with the scanning electron microscope is considered, as described hereinbefore, to be due to the agglomeration of the acicular tin oxide doped with antimony at the time of insulating covering treatment.

Subsequently, a mixture was prepared by pulverizing and mixing with a homogenizer for 30 minutes, 5 g of the insulated ultrafine powder which had been obtained by the calination, 10 g of epoxy monomer of type bisphenol A (manufactured by Asahi Denka Industrial Co., Ltd. under the trade name "EP-4100G"), 0.2 g of imidazole based curing catalyst (manufactured by Shikoku Chemical Co., Ltd. under the trade name "Curezole 2E4MZ") and 15 g of methyl ethyl ketone as the solvent. It followed that 7 vol % of the calcined powder was added. The solution thus obtained was placed in a Teflon dish, air-dried for 12 hours, and thereafter heated at 120° C. for 6 hours to prepare a cured product in the form of sheet. Subsequently, the dielectric constant of the product was measured at one MHz with an impedance/gain·faze analyzer of type 1260 manufactured by Solartorn Co., Ltd. As a result, the relative dielectric constant was 45.7.

EXAMPLE 2

The procedure in Example 1 was repeated to prepare a cured product in the form of sheet except that in the preparation thereof, use was made of 7.5 g of the insulated ultrafine powder which had been obtained by the calcianton and 7.5 g of epoxy monomer of type bisphenol A. It followed that 13 vol % of the calcined powder was added. The dielectric constant of the product was measured in the same manner as in Example 1. As a result, the relative dielectric constant was 96.2.

EXAMPLE 3

In the preparation of a cured product, use was made of spherical tin oxide which was doped with antimony and had a particle diameter of 10 to 30 nm and a specific surface area of 65 to 80 m$^2$/g (manufactured by Ishihara Sangyo Co., Ltd. under the trade name "SN-100P"), so that insulated ultrafine powder was obtained. According to observation with an electron microscope, the powder had an insulating film thickness of 2 to 10 nm. In this case, the value "d" relating to the insulating film was 0.64 nm. Thereafter, a cured product in the form of sheet was prepared in the same manner as in Example 2 except that in the preparation thereof, use was made of 9 g of the insulated ultrafine powder which had been obtained by the calcination and 6 g of epoxy monomer of type bisphenol A. It followed that 20 vol % of the calcined powder was added. The dielectric constant of the product was measured in the same manner as in Example 1. As a result, the relative dielectric constant was 88.7.

EXAMPLE 4

A spherical tin oxide which was doped with antimony which had a particle diameter of 10 to 30 nm (manufactured by Ishihara Sangyo Co., Ltd. under the trade name "SN-100P") was calcined at 1000° C. for 6 hours. As a result, the particle diameter thereof was made to be 40 to 60 nm. A cured product was prepared in the same manner as in Example 2 except that in the preparation thereof, use was made of 9 g of the insulated ultrafine powder which was obtained by calcining the resultant spherical tin oxide which was doped with antimony, and 6 g of the epoxy monomer of type bisphenol A. It followed that 20 vol % of the calcined powder was added. The dielectric constant of the product was measured in the same manner as in Example 1. As a result, the relative dielectric constant was 57.6.

Comparative Example 1

A cured product in the form of sheet was prepared in the same manner as in Example 1 except that in the preparation thereof, use was made of 5 g of acicular tin oxide which was doped with antimony (FS-10P) in place of the insulated ultrafine powder which had been obtained by calcination. It followed from the volumetric composition that 7 vol % thereof was added. An attempt which was made to measure the dielectric constant of the sheet was unsuccessful, since the sheet was an electroconductor having a volume resistivity of 11.2 Ωm. That is to say, the cured product in the form of sheet was not a dielectric.

Comparative Example 2

A cured product in the form of sheet was prepared in the same manner as in Example 1 except that in the preparation thereof, use was made of 9.3 g of barium titanate having a particle diameter of 2 μm and 2.7 g of the epoxy monomer of type bisphenol A. It followed that 20 vol % thereof was added. The dielectric constant of the product was measured in the same manner as in Example 1. As a result, the relative dielectric constant was 6.8.

Comparative Example 3

A spherical tin oxide which was doped with antimony which had a particle diameter of 10 to 30 nm (manufactured by Ishihara Sangyo Co., Ltd. under the trade name "SN-100P") was calcined at 1000° C. for 480 hours. As a result, the particle diameter thereof was made to be larger than 100 nm. A cured product was prepared in the same manner as in Example 2 except that in the preparation thereof, use was made of 9 g of the insulated ultrafine powder which was obtained by calcining the resultant spherical tin oxide which was doped with antimony and 6 g of the epoxy monomer of type bisphenol A. It followed that 20 vol % of the calcined powder was added. The dielectric constant of the product was measured in the same manner as in Example 1. As a result, the relative dielectric constant was 17.8.

Comparative Example 4

The procedure in Example 1 was repeated except that tetrapropyloxy titanate was added in an amount of 2.7 g. According to observation with an electron microscope, the powder had a titanium dioxide film thickness of 0.2 nm. In this case, the value "d" relating to the insulating film was 0.17 nm, thus causing conduction.

Comparative Example 5

The procedure in Example 3 was repeated except that tetrapropyloxy titanate was added in an amount of 6.8 g. According to observation with an electron microscope, the powder had a titanium dioxide film thickness of 0.2 nm. In this case, the value "d" relating to the insulating film was 0.17 nm, thus causing conduction.

Comparative Example 6

The procedure in Example 1 was repeated except that tetrapropyloxy titanate was added in an amount of 54 g. Since according to observation with an electron microscope the powder had a minor axis of 60 nm or larger, the insulating film thickness is considered to be 30 nm or larger. In this case the dielectric constant was 7.8.

The results in the examples and comparative examples are collectively summarized in Table 1.

TABLE 1

|  | Electroconductive Ultrafine Powder | Insulating Film | Rate of Added Filler vol % | Rate of Added Filler wt % | Relative dielectric constant (1 MHz) |
|---|---|---|---|---|---|
| Example 1 | Acicular tin oxide dopped with antimony | Titanium Dioxide | 7 | 33 | 45.7 |

TABLE 1-continued

|  | Electroconductive Ultrafine Powder | Insulating Film | Rate of Added Filler vol % | wt % | Relative dielectric constant (1 MHz) |
|---|---|---|---|---|---|
| Example 2 | Acicular tin oxide dopped with antimony | Titanium Dioxide | 13 | 50 | 96.2 |
| Example 3 | Spherical tin oxide dopped with antimony | Titanium Dioxide | 20 | 60 | 88.7 |
| Example 4 | Spherical tin oxide dopped with antimony | Titanium Dioxide | 20 | 60 | 57.6 |
| Comparative Example 1 | Acicular tin oxide dopped with antimony | — | 7 | 33 | unmeasurable due to conduction |
| Comparative Example 2 | Barium Titanate | — | 20 | 62 | 6.8 |
| Comparative Example 3 | Spherical tin oxide dopped with antimony | Titanium Dioxide | 20 | 60 | 17.8 |
| Comparative Example 4 | Acicular tin oxide dopped with antimony | Titanium Dioxide | 7 | 33 | unmeasurable due to conduction |
| Comparative Example 5 | Spherical tin oxide dopped with antimony | Titanium Dioxide | 20 | 60 | unmeasurable due to conduction |
| Comparative Example 6 | Acicular tin oxide dopped with antimony | Titanium Dioxide | 7 | 33 | 7.8 |

It is understandable from Example 1 and Comparative Example 1 that the electroconductive ultrafine powder to which insulating covering is not applied fails to function as a dielectric, and that the insulating covering imparts the properties as a dielectric to the electroconductive ultrafine powder. It is also understandable from Examples 1 to 3, especially Example 3 wherein use was made of the insulated ultrafine powder in which insulating covering was applied to the spherical electroconductive ultrafine powder and Comparative Example 2 wherein use was made of barium titanate ultrafine powder typified by prior arts that the use of the insulated ultrafine powder according to the present invention could have actualized a high dielectric constant at a markedly lower rate of addition that which has hitherto been deemed indispensable in prior arts. It is further understandable from Comparative Examples 4 and 5 that an insulating film having a thickness of less than 0.3 nm cannot be utilized as a dielectric due to conduction caused thereby. It is still further understandable from Comparative Example 6 that an insulating film having a thickness of more than the minor axis which is a key factor of the electroconductive ultrafine powder results in deteriorated dielectric constant.

What is claimed is:

1. Insulated ultrafine powder comprising electroconductive ultrafine powder which is acicular, having a minor axis in the range of 5 nm to 70 nm, and an insulating film on said electroconductive ultrafine powder, wherein the insulating film has a thickness which is 0.3 nm or larger and not larger than the minor axis of said acicular of the electroconductive ultrafine powder, said electroconductive ultrafine powder being made of a material selected from the group consisting of stannic oxide doped with antimony, indium trioxide doped with tin, zinc oxide doped with aluminum or gallium, and barium plumbate, and the insulating film comprises at least one species selected from the group consisting of an oxide having insulating properties and a nitride having insulating properties.

2. The insulated ultrafine powder according to claim 1 wherein the insulating film has a relative dielectric constant of at least 20.

3. A resin composite material which comprises at least one species selected from the group consisting of the insulated ultrafine powder as set forth in claim 1 and polymer at a volumetric ratio (the powder/the polymer) in the range of 5/95 to 50/50.

4. The resin composite material according to claim 3 which further comprises a filler.

5. The resin composite material according to claim 3 which has a relative dielectric constant of at least 20.

6. A high dielectric constant film or sheet comprising the resin composite material as set forth in claim 3 which is formed thereinto.

7. An electronic part which comprises the high dielectric constant film or sheet as set forth in claim 6.

8. The insulated ultrafine powder according to claim 1 wherein the electroconductive ultrafine powder is made of stannic oxide doped with antimony.

9. The insulated ultrafine powder according to claim 1, wherein the acicular electroconductive ultrafine powder has an aspect ratio of 2 to 100.

10. The insulated ultrafine powder according to claim 9, wherein said aspect ratio is 10 to 40.

11. The insulated ultrafine powder according to claim 1 wherein said insulating film is a metal oxide having insulating properties and a dielectric constant of at least 20.

12. The insulated ultrafine powder according to claim 11 wherein said dielectric constant is at least 100.

* * * * *